United States Patent
Ikenoue et al.

(10) Patent No.: US 7,202,168 B2
(45) Date of Patent: Apr. 10, 2007

(54) METHOD OF PRODUCING SEMICONDUCTOR DEVICE

(75) Inventors: Hiroshi Ikenoue, Hiratsuka (JP); Hisashi Kaneko, Fujisawa (JP); Masaaki Hatano, Yokohama (JP); Soichi Yamashita, Kawasaki (JP); Takashi Yoda, Machida (JP); Makoto Sekine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/136,494

(22) Filed: May 25, 2005

(65) Prior Publication Data

US 2006/0024952 A1 Feb. 2, 2006

(30) Foreign Application Priority Data

May 26, 2004 (JP) ............................ 2004-156732

(51) Int. Cl.
*H01L 21/44* (2006.01)
(52) U.S. Cl. ................. 438/687; 438/678; 257/E29.143
(58) Field of Classification Search ................ 438/687, 438/643, 678; 372/43.01; 257/E21.134, 257/E21.703, E21.584, E21.303, E29.143
See application file for complete search history.

(56) References Cited

U.S. PATENT DOCUMENTS

| | | | | | |
|---|---|---|---|---|---|
| 6,103,624 | A | * | 8/2000 | Nogami et al. | 438/687 |
| 6,143,650 | A | * | 11/2000 | Pramanick et al. | 438/643 |
| 6,242,349 | B1 | * | 6/2001 | Nogami et al. | 438/687 |
| 6,535,535 | B1 | * | 3/2003 | Yamazaki et al. | 372/43.01 |

FOREIGN PATENT DOCUMENTS

| | | |
|---|---|---|
| JP | 06-291191 | 10/1994 |
| JP | 2001-015923 | 1/2001 |
| JP | 2003-045878 | 2/2003 |

* cited by examiner

*Primary Examiner*—Matthew Smith
*Assistant Examiner*—Nicholas J. Tobergte
(74) *Attorney, Agent, or Firm*—Finnegan, Henderson, Farabow, Garrett & Dunner, L.L.P.

(57) ABSTRACT

A method of producing a semiconductor device according to an aspect of the present invention comprises forming a seed film of Cu on a substrate; polycrystallizing the seed film formed on the substrate; and forming a plated film of Cu on the polycrystallized seed film by electrolytic plating.

20 Claims, 10 Drawing Sheets

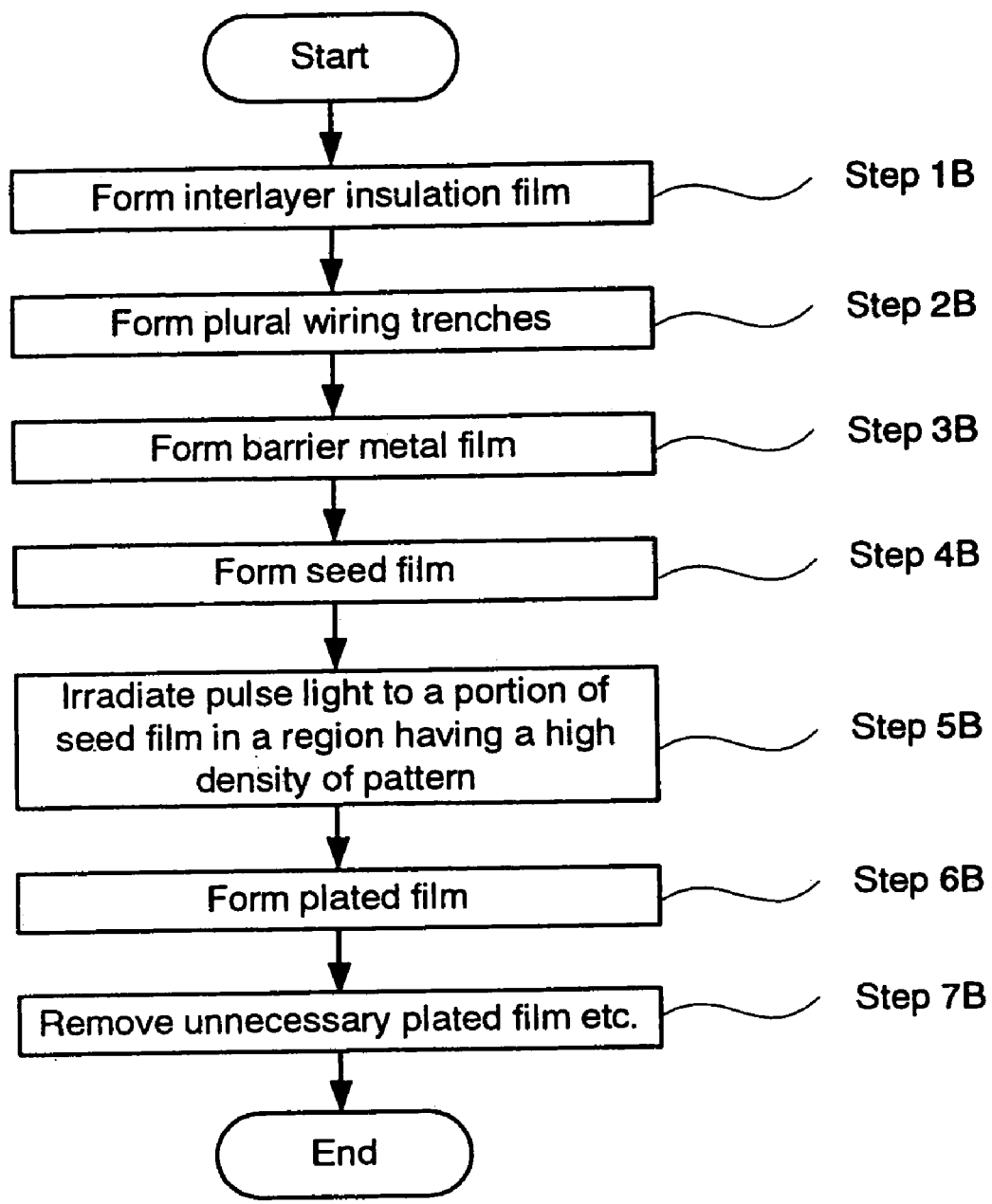

US 7,202,168 B2

METHOD OF PRODUCING SEMICONDUCTOR DEVICE

CROSS-REFERENCE TO THE INVENTION

This application is based upon and claims the benefit of priority from the prior Japanese Patent Application No. 2004-156732, filed on May 26, 2004; the entire contents of which are incorporated herein by reference.

BACKGROUND OF THE INVENTION

1. Field of the Invention

The present invention relates to a method of producing a semiconductor device.

2. Description of the Related Art

In recent years, to realize high integration and high functioning of the semiconductor device, it is required to improve an operation speed of the device. Accordingly, wiring which connects individual elements is being miniaturized and multilayered. In response to the miniaturization and multilayering, Cu having low resistance and outstanding electromigration resistance is buried into wiring trenches and via holes of an interlayer insulation film to form wiring.

Specifically, a barrier metal film and a seed film of Cu are formed on the interlayer insulation film having the wiring trenches and the via holes formed, a plated film of Cu is formed on the seed film by electrolytic plating, then the plated film and the like are removed to leave the plated film only in the wiring trenches and the via holes to form wiring. But, there is a problem that the reliability of wiring is decreased because the wiring trenches and the like are further miniaturized to form a void in the plated film.

BRIEF SUMMARY OF THE INVENTION

According to an aspect of the present invention, there is provided a method of producing a semiconductor device, comprising forming a seed film of Cu on a substrate; polycrystallizing the seed film formed on the substrate; and forming a plated film of Cu on the polycrystallized seed film by electrolytic plating.

According to another aspect of the present invention, there is provided a method of producing a semiconductor device, comprising forming a seed film of Cu on a substrate; irradiating pulse light to the seed film formed on the substrate; and forming a plated film of Cu on the seed film, to which the pulse light has been irradiated, by electrolytic plating.

BRIEF DESCRIPTION OF THE DRAWINGS

FIG. 4 is a flow chart showing a flow of a production process of a semiconductor device according to a second embodiment.

DETAILED DESCRIPTION OF THE INVENTION (First Embodiment)

Figure 1:
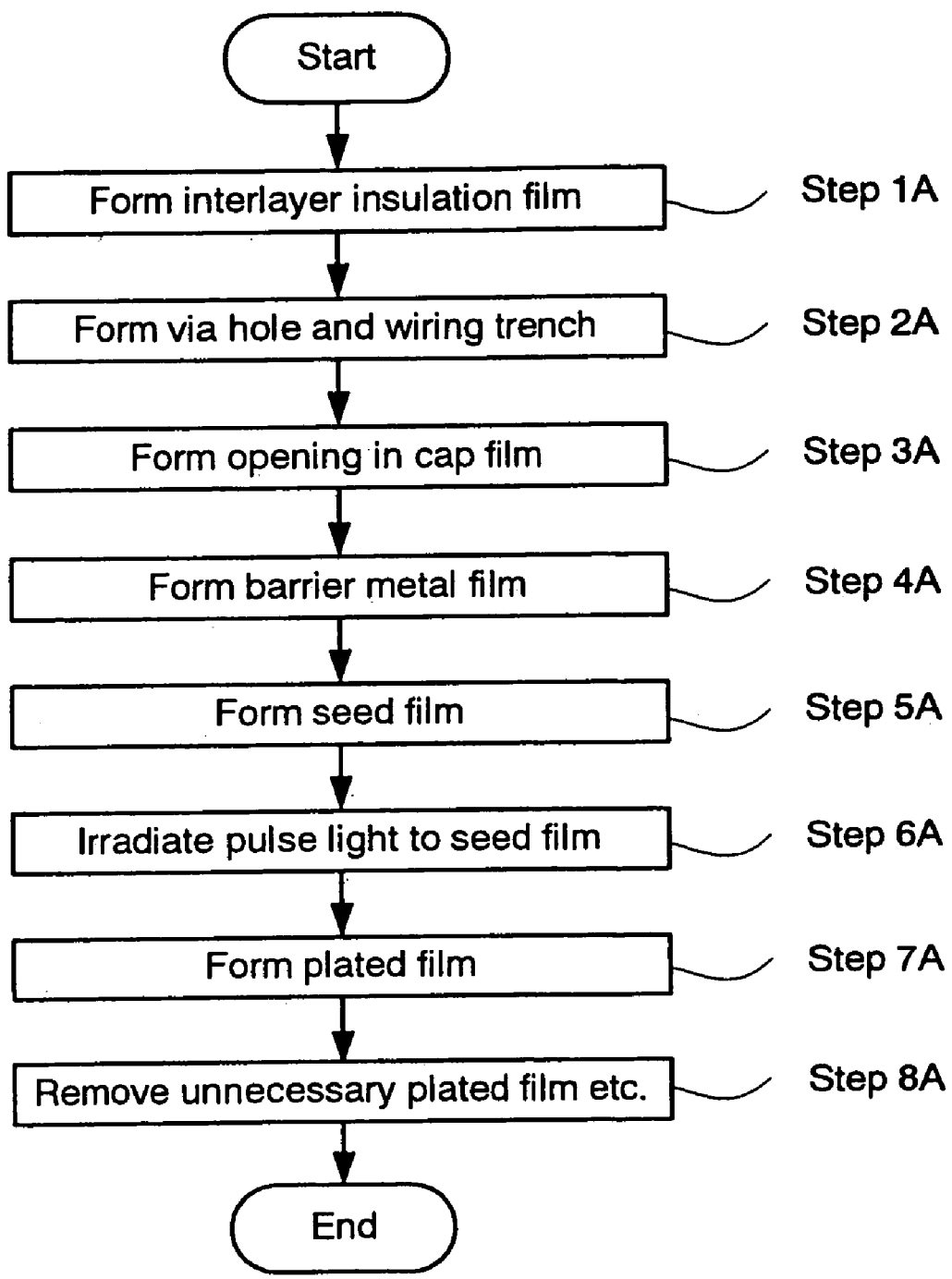
FIG. 1 is a flow chart showing a flow of a production process of a semiconductor device according to a first embodiment.

A first embodiment will be described below. FIG. 1 is a flowchart showing a flow of a production process of a semiconductor device according to this embodiment, and FIG. 2A through FIG. 2H are schematic views showing the production process of the semiconductor device according to this embodiment.

Figure 2A:
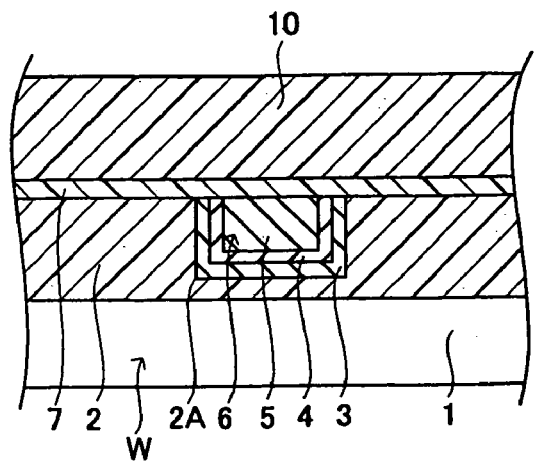
FIG. 2A through FIG. 2H are schematic views of the production process of the semiconductor device according to the first embodiment.

As shown in FIG. 2A, an interlayer insulation film 10 is formed on a semiconductor wafer W (hereinafter simply called the "wafer") by, for example, a chemical vapor deposition (CVD) method or a coating method (step 1A). The wafer W is comprised of an Si substrate 1, an interlayer insulation film 2, a barrier metal film 3, wiring 6 which is composed of a seed film 4 and a plated film 5 and a cap film 7. Elements (not shown) such as transistors are formed on the Si substrate 1, and a wiring trench 2A is formed in the interlayer insulation film 2. The barrier metal film 3 is formed on the inside surface of the wiring trench 2A, and the wiring 6 is buried in the barrier metal film 3. The cap film 7 is formed on the interlayer insulation film 2 and the wiring 6.

Examples of the constituent materials of the interlayer insulation films 2, 10 are a low dielectric constant insulation film such as an organic Si oxide film, a porous Si film and the like, or $SiO_2$ or the like. Constituent materials of the cap film 7 are SiCN, SiOC, SiN, SiC or the like.

Figure 2B:
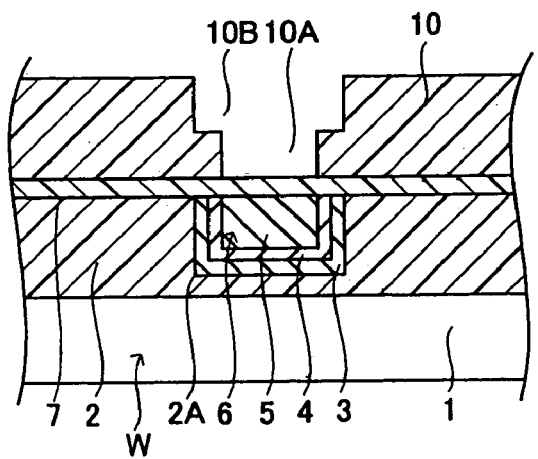

After the interlayer insulation film 10 is formed, a via hole 10A (recess) and a wiring trench 10B (recess) are formed in the interlayer insulation film 10 by the photolithography technique and Reactive Ion Etching (RIE) as shown in FIG. 2B (step 2A). To form the via hole 10A, a reflection preventing film and a chemical amplification type photoresist are applied to the interlayer insulation film 10 while turning the wafer W. After the photoresist is applied, exposure to ultraviolet rays is performed using a mask having a prescribed pattern. Then, a resist pattern is formed on the interlayer insulation film 10 by developing with a developing solution. After the resist pattern is formed on the interlayer insulation film 10, the interlayer insulation film 10 is etched by RIE with the resist pattern used as the mask to form the via hole 10A in the interlayer insulation film 10. After the via hole 10A is formed in the interlayer insulation film 10, the resist and the reflection preventing film are removed by ashing or the like. Then, the wiring trench 10B is formed by the same procedure.

Figure 2C:
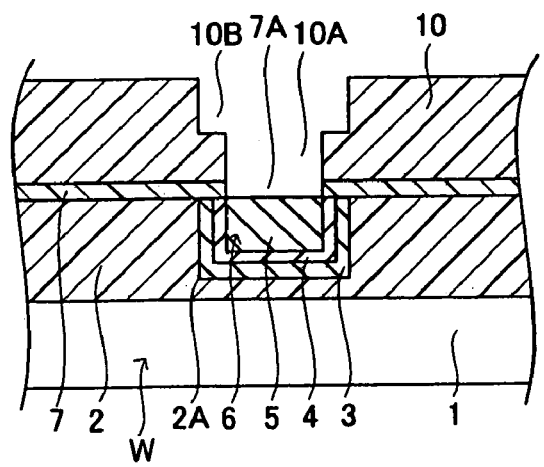

After the via hole 10A and the wiring trench 10B are formed in the interlayer insulation film 10, an opening 7A is formed in the cap film 7 as shown in FIG. 2C (step 3A).

Figure 2D:
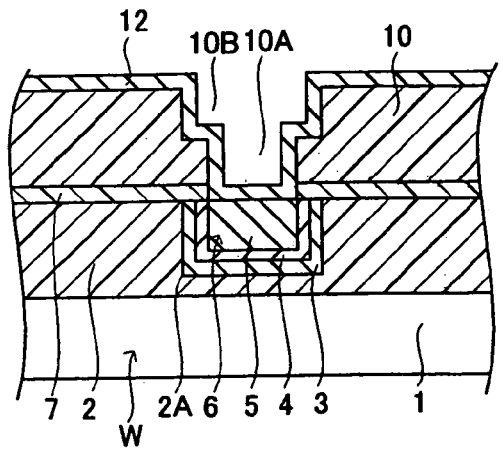

Subsequently, a barrier metal film 12 which restrains Cu from spreading into the interlayer insulation film 10 is formed on the interlayer insulation film 10 by, for example, sputtering or CVD as shown in FIG. 2D (step 4A). The constituent material of the barrier metal film 12 is, for example, a conductive material such as Ta, Ti, TaN, TiN, NbN, WN or VN. The barrier metal film 12 may also be formed by laminating these materials.

Figure 2E:
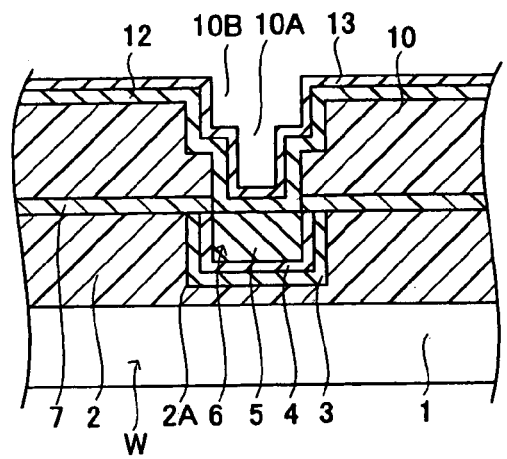

After the barrier metal film 12 is formed on the interlayer insulation film 10, a seed film 13, which allows to flow an electric current at the time of electrolytic plating, is formed on the barrier metal film 12 by, for example, sputtering as shown in FIG. 2E (step 5A). The seed film 13 is composed of Cu but may contain components other than Cu.

Figure 2F:
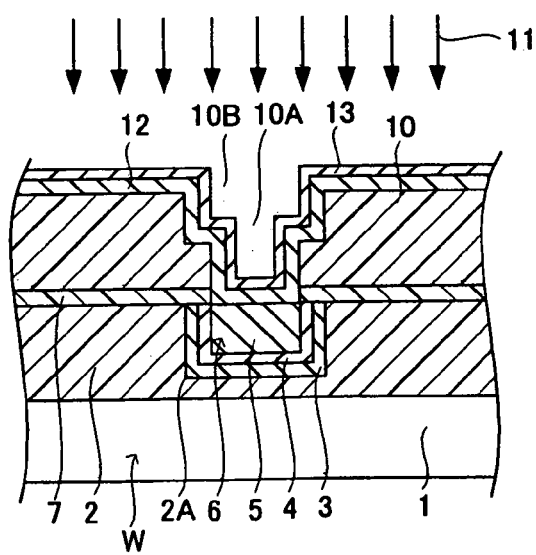

After the seed film 13 is formed on the barrier metal film 12, pulse light 11 is irradiated to the seed film 13 as shown in FIG. 2F (step 6A). The pulse light 11 can be obtained from, for example, a flash lamp, an excimer laser such as KrF excimer laser, a pulse solid laser such as Q-Switch YAG laser, or the like. Polycrystallization can be performed with high controllability by using pulse light having a wavelength of 400 nm or less because Cu has reflectance decreased considerably when a wavelength is 400 nm or less. Pulse light having a wavelength of 400 nm or less can be obtained from, for example, a KrF excimer laser, the third harmonic or fourth harmonic of a Q-switch YAG laser, or the like. And, when pulse light having a wavelength longer than the diameter of the via hole 10A and the width of the wiring trench 10B is used, the diffraction effect of light becomes large, so that it also becomes possible to irradiate pulse light to the side walls of the wiring trench 10B and the via hole 10A.

In this embodiment, the third harmonic of Q-Switch Nd YAG was used as the pulse light. This laser has a wavelength of 355 nm and a pulse width of 30 nsec.

Pulse light is irradiated to the wafer surface by scanning the wafer with the pulse light moved relative to the wafer while oscillating the pulse light. Where the pulse light is caused to scan relative to the wafer, the pulse light may be moved linearly or spirally over the wafer. If the width of the wiring trench or the diameter of the via hole formed in the wafer is larger than the wavelength of the pulse light, the pulse light maybe irradiated so that its optical axis is leaned with respect to the normal line of the wafer because the pulse light is irradiated to the side walls of the wiring trench and the via hole.

Figure 2G:
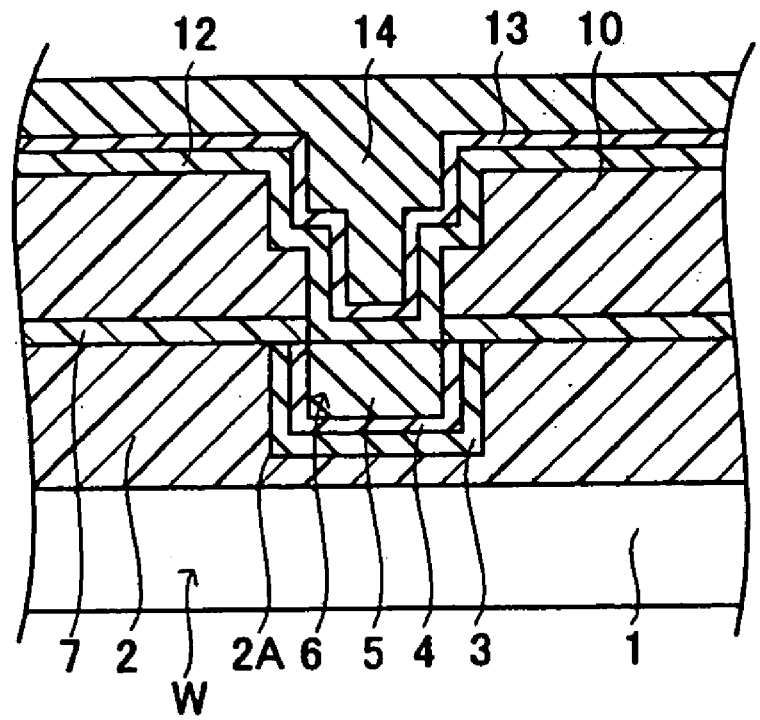

After the pulse light 11 is irradiated to the seed film 13, a plating solution is supplied onto the wafer W, and a plated film 14 is formed on the seed film 13 by electrolytic plating as shown in FIG. 2G (step 7A). The plated film 14 is formed of Cu but may contain components other than Cu.

Figure 2H:
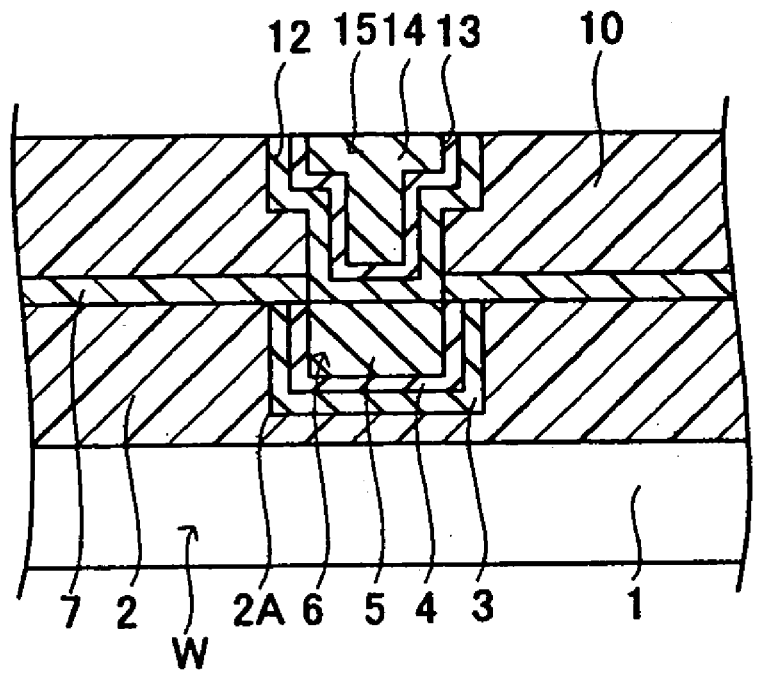

After the plated film 14 is formed on the seed film 13, it is polished by, for example, Chemical Mechanical Polishing (CMP) to remove the unnecessary barrier metal film 12, seed film 13 and plated film 14 which are on the interlayer insulation film 10 and to leave the barrier metal film 12, the seed film 13 and the plated film 14 which are present in the via hole 10A and the wiring trench 10B as shown in FIG. 2H (step 8A). Specifically, the wafer W and a polishing pad (not shown) are rotated with the wafer W kept in contact with the polishing pad, and slurry (not shown) is supplied onto the wafer W to polish the plated film 14 and the like. The plated film 14 and the like may be heat-treated before the plated film 14 is polished. Polishing is not restricted to the CMP and may be performed by a different method. An example of the different method is electrolytic polishing. Thus, wiring 15 which is connected to the wiring 6 is formed.

In the production process of the semiconductor device as shown in FIG. 1, if the plated film is formed without irradiating the pulse light to the seed film, a void is formed in the plated film when wiring is especially fine, and the reliability of wiring might be degraded. It is conceivable that the cause of the generation of voids is the generation of a triple point in the plated film. Specifically, the seed film is in an amorphous state at the time of forming the seed film, and when the plated film is formed on the seed film which is in the amorphous state, crystallization of the plated film proceeds at room temperature, so that the triple point is generated in the plated film. And, if a stress or the like is applied to the triple point, a void is presumably produced on the basis of the triple point.

It is also presumed that the void is formed because the seed film is etched by the plating solution when the seed film is dipped in the plating solution. Specifically, if the seed film is etched, the portion which is etched and has a small thickness comes to have an electrical resistance higher than that of the other portion. Therefore, it is presumed that the growing speed of the plated film on the thin portion of the seed film becomes slower than that of the other portion, and a void is formed in the pertinent portion.

Meanwhile, in this embodiment, the plated film 14 which has the formation of voids decreased can be obtained because the pulse light 11 is irradiated to the seed film 13. Specifically, when the pulse light 11 is irradiated to the seed film 13, the seed film 13 is heat-treated instantaneously, and the seed film 13 is polycrystallized. The surface of the polycrystallized film has low index planes such as (100) and (111) predominantly, and the crystal grain diameter in the surface direction becomes about 100 nm to 1 μm. Judging from generally a thickness of the seed film 13 being 100 nm or less, the seed film 13 exposed to the pulse light becomes a polycrystalline film having a columnar structure. When the polycrystalline seed film 13 which has the low index plane predominantly on the surface is plated, the plated film 14 which has the same plane index as the seed film 13 grows in a columnar form while keeping the same plane index. Thus, the formation of a triple point in the plated film 14 becomes hard, so that the factors of generating the void in the formed wiring is decreased.

It is known that, when the seed film 13 of Cu is formed in the via hole 10A, the thickness of the seed film 13 becomes small locally on the side wall. When the via hole 10A has a high aspect ratio as the wiring becomes very fine, thinning of the seed film 13 on the side wall becomes conspicuous. Besides, in the early stage of the plating step, the seed film 13 is etched when it is dipped in the plating solution and becomes thinner. This localized thinning of the seed film 13 increases the sheet resistance, causing nonuniformity in the current distribution at the time of the film formation by electrolytic plating and the generation of a void in the thinned region.

The etching speed of the Cu film with respect to the plating solution becomes slower on the low index plane than on the amorphous state. When the pulse light 11 is irradiated to the seed film 13 and the low index plane becomes predominant on the surface, it becomes possible to restrain the etching of the seed film 13 in the early stage of the plating step, the factors of generating the voids is decreased, and the reliability of the wiring is improved.

Besides, the pulse light 11 is irradiated to the seed film 13 in this embodiment, so that the seed film 13 can be polycrystallized in the thin film state. Specifically, when the seed film is heat-treated in an ordinary thermal annealing step, the seed film aggregates because it is thin, and it is hard to polycrystallize the seed film in the thin state. For example, when Ta or TaN is used as the barrier metal, it was possible to polycrystallize without causing the aggregation of the seed film by irradiation of pulse light having a pulse width of 100 nsec or less if the seed film formed of Cu had a thickness of 100 nm. Meanwhile, in the thermal annealing step in a hydrogen or inert gas atmosphere, the seed film aggregates after the thermal annealing and it becomes impossible to form a plated film of Cu.

The seed film 13 may have the thin portion reinforced by performing secondary film formation by electroless plating of Cu after the primary film formation by, for example, sputtering. In this case, the pulse light 11 may be irradiated to the seed film 13 after either of the primary film formation and the secondary film formation.

Besides, when the pulse light 11 is irradiated to the via hole 10A and the wiring trench 10B in the state before the barrier metal film 12 and the seed film 13 are formed (FIG. 2C), the plated film 14 with the number of voids decreased can be obtained. An impurity such as a reaction product at the time of the RIE might adhere to the via hole 10A and the wiring trench 10B. This impurity deteriorates the adhesion of the barrier metal film 12 and the seed film 13, and causes defective film formation such as an abnormal side wall shape, which becomes the factors of generating the void in the plated film 14. The irradiation of the pulse light 11 to the via hole 10A and the wiring trench 10B before the formation of the seed film 13 can remove the impurity adhered to the via hole 10A and the wiring trench 10B. Therefore, the plated film 14 with the number of voids further decreased can be obtained.

Wiring possessing higher reliability can also be obtained by irradiating the pulse light 11 after the plated film 14 is formed (FIG. 2G). The seed film 13 to which the pulse light 11 is irradiated has a polycrystallized structure, and the plated film 14 formed on the seed film 13 has a columnar structure predominantly, but if the wiring film thickness exceeds 1 µm, triple points are apt to be formed within the wiring. These triple points can be eliminated by irradiating the pulse light 11 after the plated film is formed, so that the reliability of wiring can be improved.

Besides, there is also a useful method that the plated film formation is discontinued in the middle of formation of the plated film, the pulse light is irradiated, and the plated film is formed to have a desired thickness.

EXAMPLE 1

Example 1 will be described below. Pulse light was irradiated to a seed film, and the crystalline state of the seed film was observed in this example.

In this example, pulse light of Q-switch Nd YAG third harmonic was used. The pulse light had a wavelength of 355 nm, a pulse width of about 50 nsec, and radiation fluence of 0.05 J/cm$^2$·pulse to 0.2 J/cm$^2$·pulse. The pulse light was irradiated to the seed film, and a change in the crystalline state of the seed film by the irradiation was observed through a Scanning Ion Microscopy (SIM). As a comparative example for comparison with the crystalline state of the seed film of this example, a seed film not irradiated by the pulse light was also observed on its crystalline state in the same manner as in this example.

The observed results will be described below. It was found that the seed film not irradiated with the pulse light had a crystal grain diameter of less than 100 nm and it was in a nearly amorphous state. Meanwhile, it was found that the seed film which was irradiated by the pulse light in this example had a crystal grain diameter of 100 nm to 1 µm and a thin film state in a polycrystalline state. It was confirmed from the results that the seed film was polycrystallized when the pulse light was irradiated to the seed film.

EXAMPLE 2

Example 2 will be described below. A seed film polycrystallized by irradiation of pulse light and a seed film which was not irradiated by pulse light and was in an amorphous state were examined for a status of recrystallization at room temperature of a plated film by X-ray diffractometry in this example.

Pulse light of Q-switch Nd YAG third harmonic was used in this example. The pulse light had a wavelength of 355 nm, a pulse width of 50 nsec, and radiation fluence of 0.05 J/cm$^2$·pulse to 0.2 J/cm$^2$·pulse. A plated film immediately after its formation and a plated film left standing at room temperature for one week were measured for peak strength by X-ray diffractometry. As a comparative example for comparison with this example, plated films were formed without irradiating the pulse light to a seed film, and one of them just after forming and the other left standing at room temperature for one week were measured for peak strength in the same manner as in this example.

It was found that the plated film which was formed without irradiation of the pulse light had an increase in particularly (111) and (200) peaks with a lapse of time and recrystallization at room temperature progressed. Meanwhile, it was found that the plated film having the seed film polycrystallized had substantially no change in the peak strength of (111), (200) and (220) low index planes. It was confirmed from the results that the plated film was hardly recrystallized at room temperature if the pulse light was irradiated to the seed film.

Figure 3A:
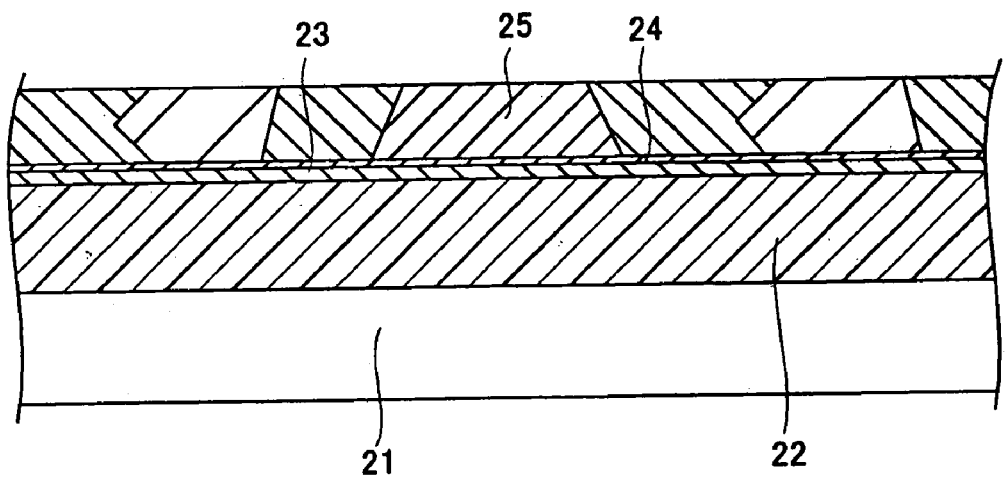
FIG. 3A is a view schematically showing the crystalline state of a plated film according to Example 2.
Figure 3B:
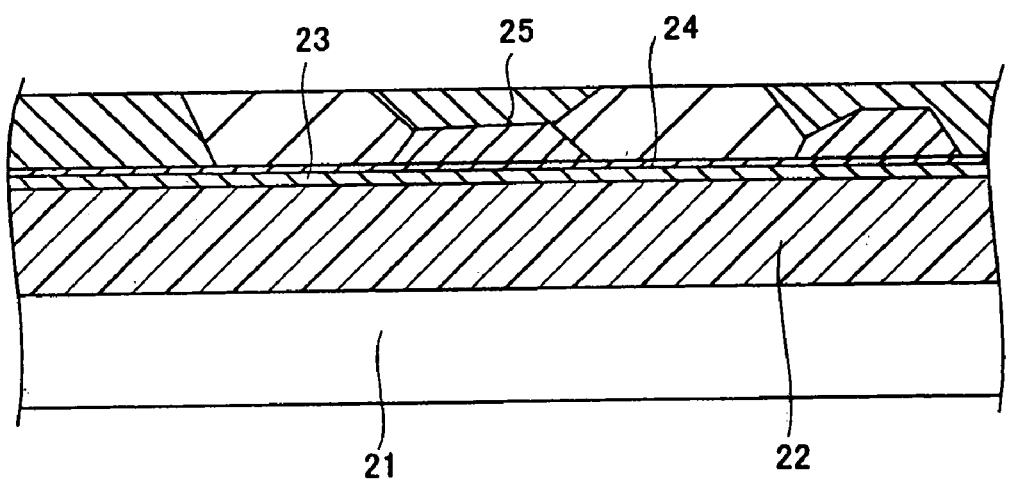
FIG. 3B is a view schematically showing the crystalline state of a plated film according to a comparative example.

The results of examining the crystalline states of the plated films by the cross-section TEM will be described. FIG. 3A is a view schematically showing a crystalline state of the plated film formed on the polycrystalline seed film, and FIG. 3B is a view schematically showing a crystalline state of the plated film formed without irradiating the pulse light. In FIG. 3A and FIG. 3B, 21 denotes an Si substrate, 22 denotes an interlayer insulation film, 23 denotes a barrier metal film, 24 denotes a seed film and 25 denotes a plated film. As shown in FIG. 3B, it is clear that many triple points are observed in the plated film which was formed without irradiating the pulse light to the seed film. Meanwhile, the plated film formed on the polycrystallized seed film has a substantially columnar structure as shown in FIG. 3A, and a triple point is hardly formed. Thus, it is presumed that the triple point which is a cause of lowering the wiring reliability is formed when the plated film formed on the amorphous seed film is recrystallized to proceed crystal growth. Meanwhile, it is presumed that plating comes to have a columnar structure on the polycrystalline seed film because it grows in the crystal plane direction of the base seed film, and the formation of a triple point which is a factor of generating a void in the wiring is restrained.

(Second Embodiment)

A second embodiment will be described below. In this embodiment, an example of selectively irradiating pulse light to a portion of the seed film in a region having a high density of wiring trench pattern will be described.

FIG. 4 is a flow chart showing a flow of the production process of the semiconductor device according to this embodiment, and FIG. 5A through FIG. 5D are schematic views of the production process of the semiconductor device according to this embodiment.

Figure 5A:
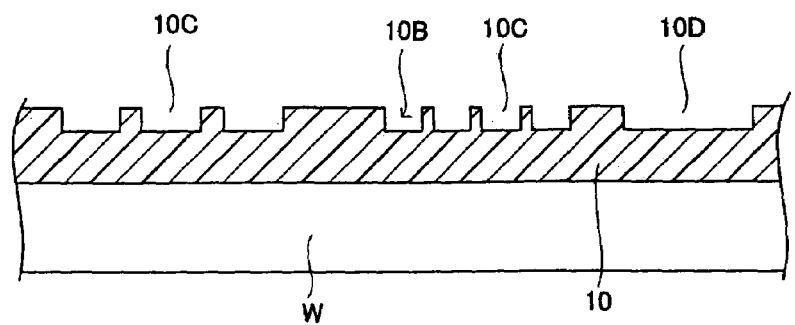
FIG. 5A through FIG. 5D are schematic views of the production process of the semiconductor device according to the second embodiment.

As shown in FIG. 4, the interlayer insulation film 10 is formed on the wafer W (step 1B). After the interlayer insulation film 10 is formed, plural wiring trenches 10B are formed in the interlayer insulation film 10 by photolithography technique and reactive ion etching (RIE) (step 2B). Here, the wiring trenches 10B each have a pattern with a region 10C having a small wiring width and a high pattern density and a region 10D having a large wiring width and a low pattern density as shown in FIG. 5A.

After the wiring trenches 10B are formed in the interlayer insulation film 10, the barrier metal film 12 is formed on the interlayer insulation film 10 (step 3B). After the barrier metal film 12 is formed on the interlayer insulation film 10, the seed film 13 is formed on the barrier metal film 12 (step 4B).

Figure 5B:
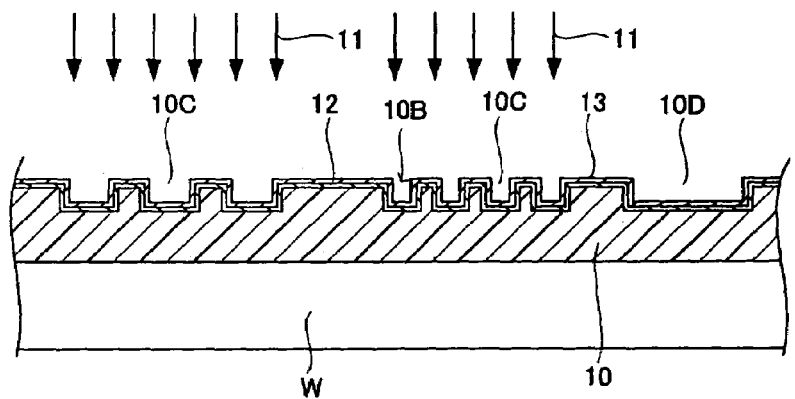

After the seed film 13 is formed on the barrier metal film 12, the pulse light 11 is selectively irradiated to a portion of the seed film 13 in the region 10C having the high pattern density as shown in FIG. 5B (step 5B).

Figure 5C:
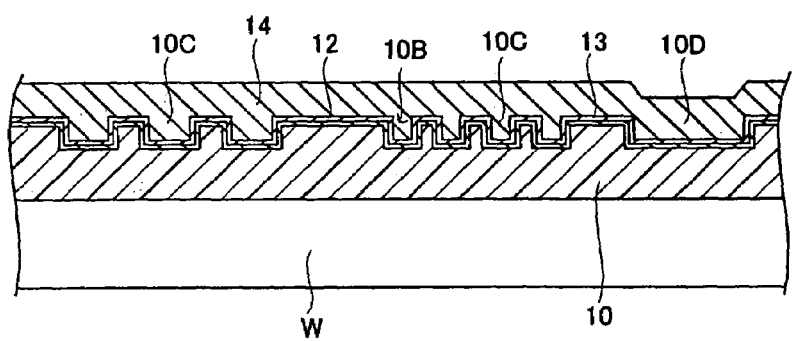

After the pulse light 11 is selectively irradiated, a plating solution is supplied onto the wafer W, and a plated film 14 is formed on the seed film 13 by electrolytic plating as shown in FIG. 5C (step 6B).

Figure 5D:
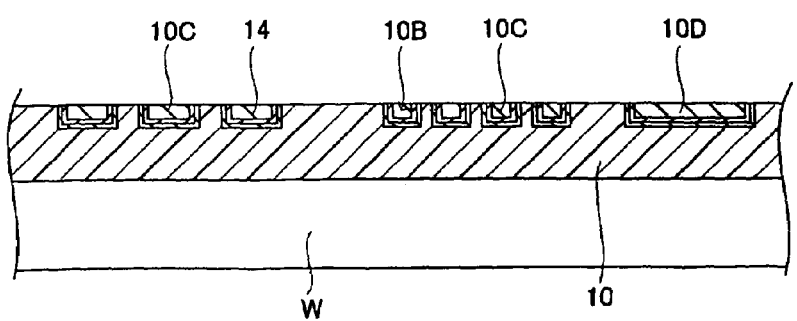

After the plated film 14 is formed on the seed film 13, it is polished by, for example, CMP, to remove unnecessary barrier metal film 12, seed film 13 and plated film 14 on the interlayer insulation film 10 to leave the barrier metal film 12, the seed film 13 and the plated film 14 which are present in the wiring trench 10B as shown in FIG. 5D (step 7B).

It is known that the plating growth is promoted in the region having a high pattern density, and the plated film rises in that region. To form Cu wiring, it is necessary to remove the rises (hump). As a result, the surface has a recessed portion in the other region having a low pattern density, and a dishing or erosion occurs. On the other hand, this embodiment can restrain a hump from being formed by irradiating the pulse light 11 to a portion of the seed film 13 in the region 10C having a high pattern density. When the portions irradiated and not irradiated by the pulse light 11 are compared, the portion irradiated by the pulse light 11 has a film forming speed reduced by 10 to 20% with respect to that of the unirradiated portion. It is presumed that the growing speed of plating on the low index plane seed film is lower than that on the amorphous seed film, and the plating growing speed lowers in the pulse light irradiation region by irradiating the pulse light to change the seed film from the amorphous state to a polycrystalline structure where the low index plane is predominant. Utilization of this phenomenon makes a hump hardly formed and can restrain a dishing or erosion.

EXAMPLE 3

Example 3 will be described below. In this example, pulse light was irradiated to a portion of the seed film in a region having a high pattern density, and the state of a plated film was observed after the plated film was formed on the seed film.

In this example, pulse light of Q-switch Nd YAG third harmonic was used. The pulse light had a wavelength of 355 nm, a pulse width of about 50 nsec and a radiation fluence of 0.15 J/cm²·pulse. The seed film had a thickness of 60 nm and a pitch width of an L&S (line and space) of 0.30 nm. In this example, the radiation fluence is 0.15 J/cm²·pulse but adjusted appropriately depending on the seed film thickness and pattern size. The pulse light was irradiated to a portion of the seed film in the region having a high pattern density. Then, the plated film was formed in a thickness of 700 nm on the seed film. And, the plated film was observed on its state.

The observed results will be described. Substantially no hump was observed on the plated film according to this example. It was confirmed from the results that when the pulse light was irradiated to the seed film, the formation of humps on the plated film was restrained.

(Third Embodiment)

A third embodiment will be described below. In this embodiment, an example of selective irradiation of pulse light to a portion of the seed film at the inlets of through plug forming recesses formed in the Si substrate will be described.

Figure 6:
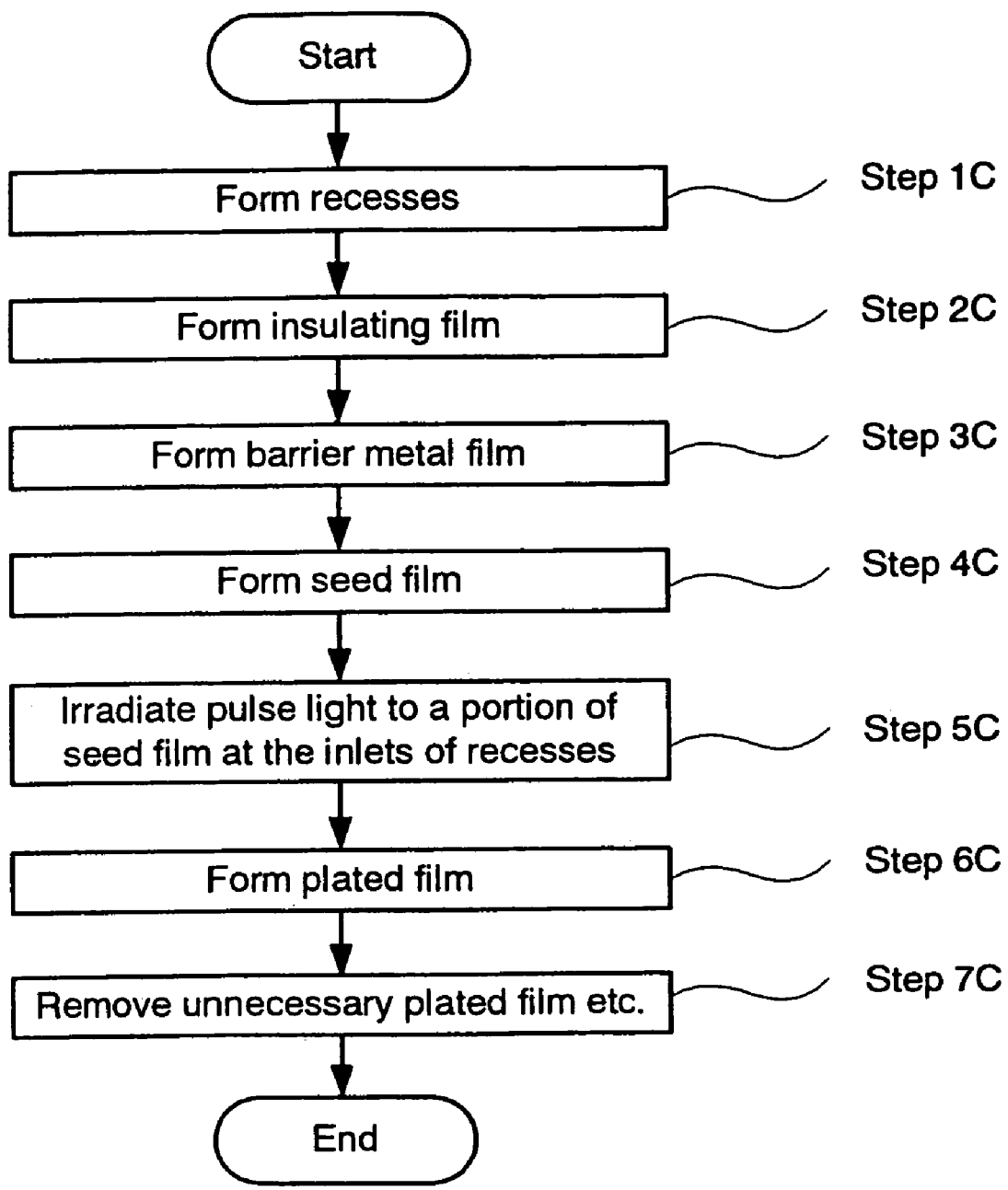
FIG. 6 is a flow chart showing a flow of a production process of a semiconductor device according to a third embodiment.
Figure 7A:
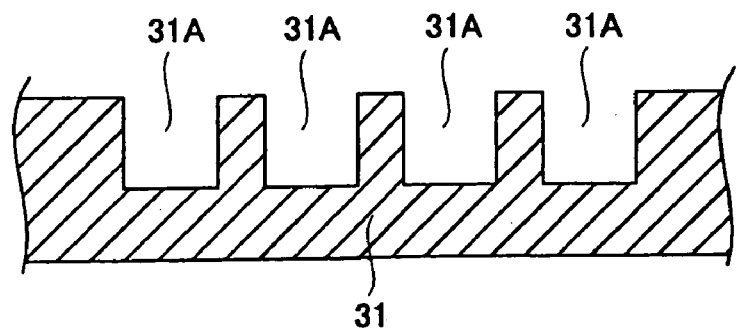
FIG. 7A through FIG. 7F are schematic views of the production process of the semiconductor device according to the third embodiment.
Figure 7B:
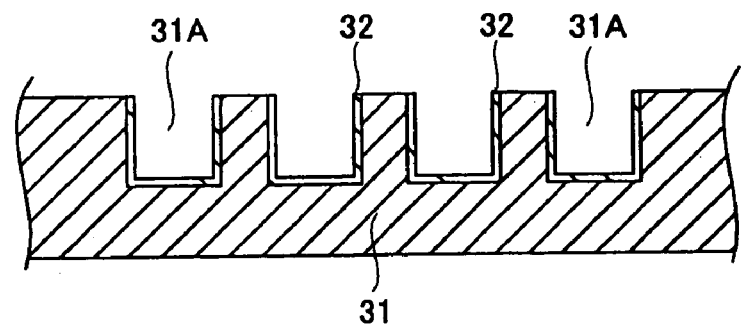
Figure 7C:
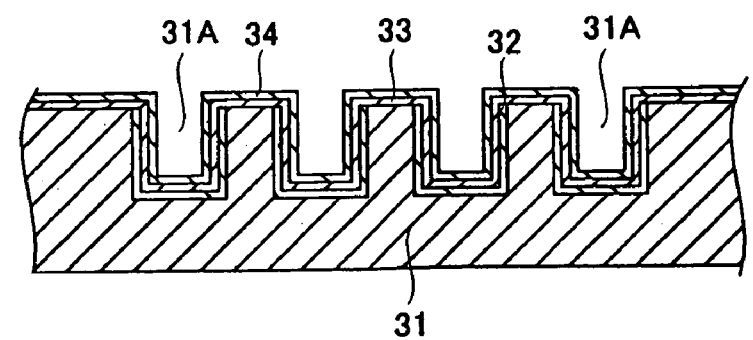

FIG. 6 is a flow chart showing a flow of the production process of the semiconductor device according to this embodiment, and FIG. 7A through FIG. 7C are schematic views showing a production process of the semiconductor device according to this embodiment.

As shown in FIG. 7A, recesses 31A are formed in an Si substrate 31 by, for example, reactive ion etching (step 1C). After the recesses 31A are formed in the Si substrate 31, an insulating film 32 composed of SiN, $SiO_2$ or the like is formed on the side walls of the recesses 31A as shown in FIG. 7B (step 2C).

Subsequently, a barrier metal film 33 is formed on the insulating film 32 as shown in FIG. 7C, and a seed film 34 is formed on the barrier metal film 33 (step 3C and step 4C).

Figure 7D:
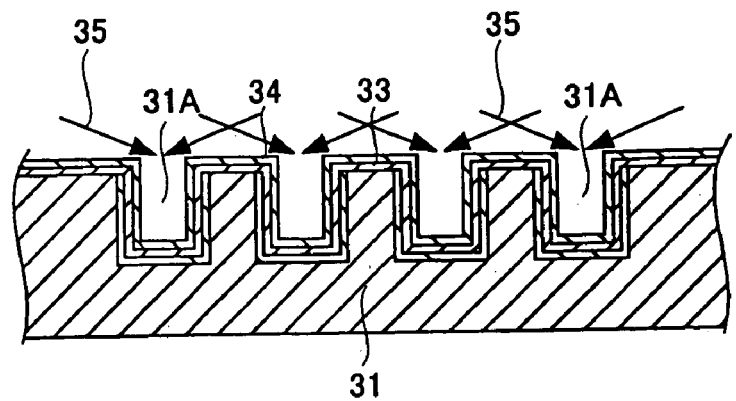

After the seed film 34 was formed on the barrier metal film 33, pulse light 35 is selectively irradiated to a portion of the seed film 34 at the inlets of the recesses 31A as shown in FIG. 7D (step 5C). Here, the generation method, irradiation method, pulse width, wavelength and the like of the pulse light 35 are the same as those of the pulse light 11.

Figure 7E:
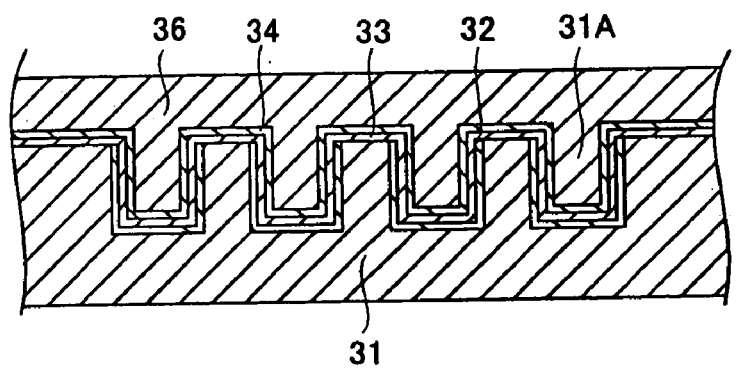

After the pulse light 35 is irradiated to the portion of the seed film 34 at the inlets of the recesses 31A, a plating solution was supplied to the seed film 34, and a plated film 36 is formed on the seed film 34 by electrolytic plating as shown in FIG. 7E (step 6C).

Figure 7F:
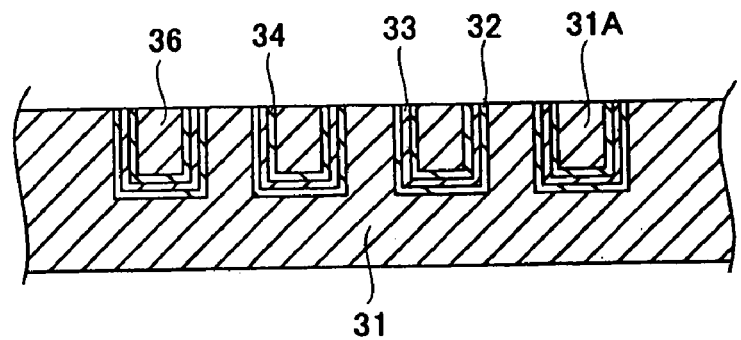

After the plated film 36 was formed on the seed film 34, it is polished by, for example, CMP to remove the unnecessary barrier metal film 33, seed film 34 and plated film 36 which are on the Si substrate 31 so as to leave the barrier metal film 33, the seed film 34 and the plated film 36 which are present in the recesses 31A as shown in FIG. 7F (step 7C). Thus, the recesses 31A have a flat top, so that it becomes possible to form wiring on the top. After elements and wiring are formed on the surface of the Si substrate 31 depending on a purpose, a through plug which has Cu buried in the recesses 31A and exposed to the back surface of the Si substrate 31 can be obtained by polishing the Si substrate 31 from its back surface, and it becomes possible to connect to another Si substrate and mounting substrate.

In this embodiment, the pulse light 35 is selectively irradiated to the portions of the seed film 34 at the inlets of the recesses 31A, so that the generation of a void can be restrain ed. Specifically, when the recesses 31A are buried by plating, the plating growing speed at the inlets of the recesses 31A is fast, so that there is a possibility that a void is formed in the recesses 31A. Meanwhile, in this embodiment, the recesses 31A are buried from their bottoms by plating because the pulse light 35 is selectively irradiated to the portions of the seed film 34 at the inlets of the recesses 31A to restrain the plating growth at the inlets of the recesses 31A. Therefore, the generation of voids becomes hard.

The present invention is not limited to the descriptions in the above embodiments, and the configuration, materials and arrangement of individual members can be modified as required without deviating from the spirit and the scope of the present invention. In the first embodiment, wiring having a dual damascene structure was described but it may be wiring having a single damascene structure.

What is claimed is:

1. A method of producing a semiconductor device, comprising:
   forming a seed film of Cu on a substrate, wherein the substrate has one or more recesses on its surface;
   irradiating a first pulse light to the recesses before a seed film is formed;
   irradiating a second pulse light to the seed film formed on the substrate; and
   forming a plated film of Cu on the seed film, to which the second pulse light has been irradiated, by electrolytic plating.

2. A method of producing a semiconductor device, comprising:
   preparing a substrate;
   forming, on said substrate, a first region in which at least one recess is formed and a second region in which other recesses are formed, so that a pattern density of said other recesses in said second region is greater than that in the first region;
   forming a seed film of Cu on said substrate;
   selectively irradiating a pulse light to a portion of the seed film formed in the second region; and
   forming a plated film of Cu on the portion of the seed film by electrolytic plating.

3. A method of producing a semiconductor device, comprising:
   forming a seed film of Cu on a substrate, wherein the substrate has one or more recesses on its surface;
   irradiating a first pulse light to the seed film formed on the substrate; and
   forming a plated film of Cu on the seed film, to which the first pulse light has been irradiated, by electrolytic plating,
   wherein the formation of the plated film comprises forming a first plated film and forming a second plated film on the first plated film; and further comprising irradiating pulse light to the first plated film between the formation of the first plated film and the formation of the second plated film.

4. The producing method according to claim 1, wherein the second pulse light has a pulse width of 100 nanosecond or less.

5. The producing method according to claim 1, wherein the second pulse light has a wavelength of 400 nm or less.

6. The producing method according to claim 1, wherein the second pulse light is emitted from any of a flash lamp, an excimer laser, and a pulse solid laser.

7. The producing method according to claim 1, wherein the second pulse light is irradiated to scan the substrate by moving the second pulse light relative to the substrate.

8. The producing method according to claim 7, wherein scanning the substrate with the second pulse light is conducted by moving the second pulse light linearly or spirally over the substrate.

9. The producing method according to claim 1, wherein the substrate comprises a semiconductor substrate and an insulating film, wherein the insulating film is formed above the semiconductor substrate and has the recesses formed on its surface.

10. The producing method according to claim 1, wherein the second pulse light has a wavelength which is larger than a dimension of the recesses.

11. The producing method according to claim 1, wherein the second pulse light has a wavelength which is smaller than a dimension of the recesses, and the second pulse light is irradiated so that the optical axis of the pulse light is inclined with respect to a normal line of the substrate.

12. The producing method according to claim 1, further comprising removing the plated film outside the recesses after the plated film is formed.

13. The producing method according to claim 1, further comprising irradiating a third pulse light to the plated film after the plated film is formed.

14. The producing method according to claim 1, wherein the formation of the plated film comprises forming a first plated film and forming a second plated film on the first plated film; and further comprising irradiating a third pulse light to the first plated film between the formation of the first plated film and the formation of the second plated film.

15. The producing method according to claim 1, wherein the substrate comprises an Si substrate which has the recesses formed on its surface, and the second pulse light is irradiated to a portion of the seed film at the inlet of the recesses.

16. The producing method according to claim 1, wherein the seed film formed on the substrate is polycrystallized through the irradiation of the second pulse light.

17. The producing method according to claim 2, wherein the pulse light has a pulse width of 100 nanosecond or less.

18. The producing method according to claim 2, wherein the pulse light has a wavelength of 400 nm or less.

19. The producing method according to claim 2, wherein the pulse light is emitted from any of a flash lamp, an excimer laser, and a pulse solid laser.

20. The producing method according to claim 2, wherein the seed film formed on the substrate is polycrystallized through the irradiation of said pulse light.

* * * * *